United States Patent
Yomogida

(10) Patent No.: US 9,790,606 B2
(45) Date of Patent: Oct. 17, 2017

(54) METHOD OF TREATING GOLD OR GOLD ALLOY WITH A SURFACE TREATMENT SOLUTION COMPRISING A DISULFIDE COMPOUND

(71) Applicant: Rohm and Haas Electronic Materials LLC, Marlborough, MA (US)

(72) Inventor: Koichi Yomogida, Niigata (JP)

(73) Assignee: Rohm and Haas Electronics Materials LLC, Marlborough, MA (US)

( * ) Notice: Subject to any disclaimer, the term of this patent is extended or adjusted under 35 U.S.C. 154(b) by 138 days.

(21) Appl. No.: 14/556,154

(22) Filed: Nov. 30, 2014

(65) Prior Publication Data
US 2015/0152565 A1    Jun. 4, 2015

(30) Foreign Application Priority Data
Nov. 29, 2013    (JP) ................. 2013-248287

(51) Int. Cl.
| | | |
|---|---|---|
| C25D 3/48 | (2006.01) | |
| C23C 22/04 | (2006.01) | |
| C23C 22/05 | (2006.01) | |
| C23C 22/60 | (2006.01) | |
| C23F 11/10 | (2006.01) | |
| C23F 11/16 | (2006.01) | |
| H05K 3/28 | (2006.01) | |
| C25D 5/48 | (2006.01) | |

(52) U.S. Cl.
CPC ............. *C25D 3/48* (2013.01); *C23C 22/05* (2013.01); *C23C 22/60* (2013.01); *C23F 11/10* (2013.01); *C23F 11/161* (2013.01); *C25D 5/48* (2013.01); *H05K 3/282* (2013.01); *H05K 2203/122* (2013.01)

(58) Field of Classification Search
None
See application file for complete search history.

(56) References Cited

U.S. PATENT DOCUMENTS

| | | | |
|---|---|---|---|
| 5,347,015 A | 9/1994 | Keller | |
| 6,627,329 B1 | 9/2003 | Shintani | |
| 7,282,602 B2 * | 10/2007 | Huang | C07C 323/66 562/103 |
| 8,703,243 B2 | 4/2014 | Abys et al. | |
| 2003/0092681 A1 * | 5/2003 | Hausheer | A61K 31/095 514/127 |
| 2003/0207114 A1 | 11/2003 | Atzesdorfer | |
| 2007/0012576 A1 * | 1/2007 | Binstead | C25D 3/38 205/291 |
| 2008/0261025 A1 | 10/2008 | Abys | |
| 2009/0121192 A1 * | 5/2009 | Abys | C23C 22/02 252/392 |
| 2010/0151263 A1 * | 6/2010 | Abys | C23C 22/03 428/457 |
| 2010/0291303 A1 * | 11/2010 | Abys | C23C 18/54 427/343 |
| 2012/0175022 A1 | 7/2012 | Abys | |

OTHER PUBLICATIONS

European Search Report for corresponding European Application No. 14 19 5604, dated Apr. 2, 2015.
Search report from corresponding Chinese 201410858255.1 application, dated Sep. 22, 2016.

* cited by examiner

*Primary Examiner* — Francisco Tschen
(74) *Attorney, Agent, or Firm* — John J. Piskorski

(57) ABSTRACT

To provide a surface treatment solution and treatment method for gold or gold alloy plating that effectively suppresses corrosion of underlying metal or substrate metal from pinholes that develop on the gold or gold alloy plating film.

[Solution] A surface treatment solution containing a disulfide compound is brought into contact with a gold or gold alloy plating film. A compound represented by the following formula (2) is preferred as the disulfide compound.

$$X^1O_3S-R^3-S-S-R^4-SO_3X^2 \qquad (2)$$

in the formula, $R^3$ and $R^4$ independently represent a linear or branched alkylene group having from 1 to 10 carbon atoms, cyclic alkylene group having from 3 to 10 carbon atoms, or phenylene group, $R^3$ and $R^4$ independently may be substituted by one or more substituents selected from an alkyl group, halogen atom, hydroxyl group, or alkoxy group, and $X^1$ and $X^2$ represent monovalent cations.

2 Claims, No Drawings

METHOD OF TREATING GOLD OR GOLD ALLOY WITH A SURFACE TREATMENT SOLUTION COMPRISING A DISULFIDE COMPOUND

FIELD OF THE INVENTION

The present invention relates to a surface treatment method for gold or gold alloy plating formed on a metal and a surface treatment solution for use in this method. More specifically, the present invention relates to a sealing method for gold or gold alloy plating film that effectively suppresses corrosion of the underlying metal from pinholes that develop on the gold or gold alloy plating film, and a sealing agent.

BACKGROUND OF THE INVENTION

Gold or gold alloy plating has been widely utilized in recent years in electronic equipment and electronic components, especially to protect the connection terminals of electronic components and the like, because of its solder wetting spreadability, electrical properties, corrosion resistance, wear resistance, and the like. Gold plating is also used as surface treatment of the electrode terminals of semiconductor elements and as surface treatment of electronic components such as connectors that connect electronic equipment. The gold plating film used as a surface treatment must have solder wetting spreadability, corrosion resistance, wear resistance, and electrical conductivity given the utilization characteristics of connectors that connect electronic equipment.

However, since gold is expensive, the amount used must also be kept down. Nonetheless, when the gold plating film is thinned to keep down the amount of gold used, pinholes in the gold plating film increase. These pinholes cause problems such as corrosion of the substrate of the gold plating film, raise the contact resistance, and lower the reliability due to the penetration of water, chlorides, and other such corrosive substances.

Treatment to prevent corrosion called sealing is carried out to solve this problem. For example, JP Kokai 2003-129257 describes a water-based sealing agent containing an inhibitor selected from benzotriazole compounds, mercaptobenzothiazole compounds, or triazinethiol compounds, a surfactant, and an amine compound. JP Kokai 2000-17483 describes a method of bringing a substrate provided with a gold-containing metal film on the surface into contact with an aqueous solution containing benzothiazole or a derivative thereof and forming a anticorrosive film on the substrate surface. JP Kokai 2000-15743 describes a plating material obtained by forming an organic material bonding layer consisting of an organic compound containing a thiol group (—SH) on a gold or gold alloy plating layer and also forming a lubricating layer on top.

These methods, however, do not have an adequate anticorrosive effect, and a surface treatment agent having a higher anticorrosive effect is demanded.

SUMMARY OF THE INVENTION

Therefore, the purpose of the present invention is to provide a surface treatment agent for gold or gold alloy plating film having a better anticorrosive effect than that of the prior art while not harming properties such as solder wetting spreadability, corrosion resistance, wear resistance, electrical conductivity, and the like, and a surface treatment method.

As a result of in-depth studies, the present inventors discovered that a surface treatment solution containing at least one type of disulfide compound can effectively prevent corrosion of the underlying metal without harming the properties of gold or gold alloy plating by being brought into contact with a gold or gold alloy plating film formed on a metal and thereby perfected the present invention.

Specifically, the present invention in one embodiment relates to a surface treatment method for gold or gold alloy plating film formed on a metal wherein the surface treatment method includes a step for bringing the gold or gold alloy plating film into contact with a surface treatment solution containing at least one type of disulfide compound.

The invention in another embodiment relates to a surface treatment solution for treating the surface of a gold or gold alloy plating film formed on a metal wherein the surface treatment solution is characterized by containing at least one type of disulfide compound represented by the following formula (1)

$$R^1\text{—S—S—}R^2 \qquad (1)$$

where $R^1$ and $R^2$ independently represent a linear or branched alkyl group having from 1 to 10 carbon atoms, cyclic alkyl group having from 3 to 10 carbon atoms, aryl group having from 6 to 10 carbon atoms, or N,N-dialkyl-thiocarbamoyl group, $R^1$ and $R^2$ independently may be substituted by one or more substituents selected from an alkyl group, for example, a linear or branched alkyl group having from 1 to 5 carbon atoms, halogen atom, hydroxyl group, alkoxy group, for example, a linear or branched alkoxy group having from 1 to 5 carbon atoms, sulfonate group or salt thereof.

The invention in yet another embodiment is a method for forming a film on the surface of a gold or gold alloy plating film formed on a metal where the method is characterized by including a step for bringing a gold or gold alloy plating film into contact with a surface treatment solution containing at least one type of disulfide compound.

DETAILED DESCRIPTION OF THE INVENTION

In this specification, ° C. means degrees Celsius; g/L means grams per liter; mg/L means milligrams per liter; pm means micrometer; ASD means A/dm² means amperes per decimeter and mA means milliamperes. In addition, percent (%) means wt % unless otherwise noted in this specification. In this specification, "alkyl" and "alkylene" include saturated hydrocarbon groups having linear, branched, or cyclic moieties or a combination of these moieties.

The surface treatment method of the present invention is characterized by effecting contact between a gold or gold alloy plating film formed on a metal and a surface treatment solution containing at least one type of disulfide compound. The surface treatment of the present invention can be sealing of a gold or gold alloy plating film. The surface treatment of the present invention can be an anticorrosive treatment of the underlying metal of a gold or gold alloy plating film. Examples of underlying metals include nickel and alloys thereof.

A disulfide compound means an organic compound having an —S—S— bond. The use of at least one type of disulfide compound makes it possible to obtain a better anticorrosive effect than through the use of a heterocyclic compound or a compound having a thiol group.

Compounds represented by the following general formula (1) are preferred among disulfide compounds.

$$R^1-S-S-R^2 \quad (1)$$

In the formula, $R^1$ and $R^2$ independently represent a linear or branched alkyl group having from 1 to 10 carbon atoms, cyclic alkyl group having from 3 to 10 carbon atoms, aryl group having from 6 to 10 carbon atoms, or N,N-dialkylthiocarbamoyl group, $R^1$ and $R^2$ independently may be substituted by one or more substituents selected from an alkyl group, for example, a linear or branched alkyl group having from 1 to 5 carbon atoms, halogen atom, hydroxyl group, alkoxy group, for example, a linear or branched alkoxy group having from 1 to 5 carbon atoms, sulfonate group or salt thereof. An alkyl group of $R^1$ and $R^2$ preferably has from 1 to 6 carbon atoms. The two alkyl groups that bond to N of the N,N-dialkylthiocarbamoyl group are linear or branched alkyl groups having from 1 to 5 carbon atoms; these two alkyls may be the same or different.

Examples of $R^1$ and $R^2$ include a methyl group, ethyl group, propyl group, butyl group, pentyl group, hexyl group, cyclohexyl group, octyl group, decyl group, and other such alkyl groups; hydroxymethyl group, hydroxyethyl group, hydroxypropyl group, hydroxybutyl group, hydroxyhexyl group, hydroxycyclohexyl group, hydroxyoctyl group, hydroxydecyl group, and other such alkyl groups substituted by hydroxyl groups; phenyl group, benzyl group, 3-methylphenyl group, 4-methylphenyl group, and other such aryl groups; aryl groups in which part of the above aryl groups has been substituted by a hydroxyl group; sulfomethyl group, sulfoethyl group, sulfopropyl group, sulfobutyl group, 3-phenylsulfonate group, 4-phenylsulfonate group, and other such alkyl or aryl groups substituted by sulfonate groups; N,N-dimethylthiocarbamoyl group, N,N-diethylthiocarbamoyl group, and other such N,N-dialkylthiocarbamoyl groups.

Preferably, at least one of $R^1$ and $R^2$ is substituted by a sulfonate group or salt thereof. A salt of sulfonic acid means a sodium salt, potassium salt, calcium salt, barium salt, and the like. Moreover, both $R^1$ and $R^2$ are preferably substituted by a sulfonate group or salt thereof.

Disulfide compounds represented by the following general formula (2) can be given as examples of when both $R^1$ and $R^2$ are substituted by a sulfonate group or salt thereof.

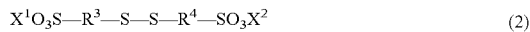

$$X^1O_3S-R^3-S-S-R^4-SO_3X^2 \quad (2)$$

In general formula (2), $R^3$ and $R^4$ independently represent a linear or branched alkylene group having from 1 to 10 carbon atoms, cyclic alkylene group having from 3 to 10 carbon atoms, or phenylene group, $R^3$ and $R^4$ independently may be substituted by one or more substituents selected from an alkyl group, for example, a linear or branched alkyl group having from 1 to 5 carbon atoms, halogen atom, hydroxyl group, or alkoxy group, for example, a linear or branched alkoxy groups having from 1 to 5 carbon atoms. When $R^3$ and $R^4$ are alkylene groups, they preferably have from 1 to 6 carbon atoms, more preferably from 1 to 4. When $R^3$ and $R^4$ are cyclic alkylene groups, they preferably have from 3 to 6 carbon atoms, more preferably 3 or 4. Examples of $R^3$ and $R^4$ include methylene, ethylene, propylene, and butylene. $X^1$ and $X^2$ represent monovalent cations; examples include a hydrogen ion, sodium ion, potassium ion, and the like.

Examples of preferred disulfide compounds include bis-(3-sulfopropyl)disulfide and a sodium salt or potassium salt thereof, 2-hydroxyethyl disulfide, methyl propyl disulfide, methyl phenyl disulfide, and the like. Bis-(3-sulfopropyl) disulfide and a sodium salt or potassium salt thereof are most preferred among these. One or more types of disulfide compounds can also be used in mixture.

The surface treatment solution of the present invention can be prepared by dissolving a disulfide compound in a solvent. The solvent is not particularly restricted as long as it can dissolve the disulfide compound. Water or a mixed solvent of water and organic solvent can be used. Water or a mixed solvent of water and a water-miscible organic solvent is preferred. An even more preferred solvent is water.

The content of disulfide compound in the surface treatment solution of the present invention is preferably 0.01 g/L or higher, more preferably 0.1 g/L or higher, and ideally 0.5 g/L or higher. The content of disulfide compound is also preferably 30 g/L or lower, more preferably 10 g/L or lower, and ideally 5 g/L or lower.

The surface treatment solution of the present invention can also contain one or more types of surfactant, pH adjuster, or other such optional components.

While any type of surfactant can be used, nonionic surfactants are preferred. The surfactant mainly plays the role of a wetting agent in the surface treatment solution of the present invention. Examples of preferred nonionic surfactants include polyethylene glycol, polyoxyalkylene monobutyl ether, polyoxypropylene glycol, and ethylene glycol-propylene glycol block polymers.

A pH adjuster is used to adjust the surface treatment solution of the present invention to the desired pH. Any pH adjuster can be used, such as hydrochloric acid, nitric acid, sulfuric acid, phosphoric acid, citric acid, potassium hydroxide or sodium hydroxide or another such metal hydroxide, sodium carbonate, other such carbonates, and the like.

The pH of the surface treatment solution of the present invention is preferably 3 or higher, more preferably 4 or higher. The pH of the surface treatment solution of the present invention is also preferably 14 or lower, more preferably 12 or lower.

The temperature during the surface treatment of the present invention is preferably 10° C. or higher, more preferably 20° C. or higher, and preferably 60° C. or lower, more preferably 45° C. or lower.

The contact time between the surface treatment solution of the present invention and a gold or gold alloy plating film is preferably 0.1 second or more, more preferably 1 second or more, and preferably 300 seconds or less, more preferably 60 seconds or less.

Contact with the surface treatment solution of the present invention may be accomplished by any method. For example, the surface treatment solution may be applied to or sprayed on the gold or gold alloy plating film. Alternatively, the gold or gold alloy plating film may be dipped in the surface treatment solution. Although electrolysis as described in JP Kokai 2003-129257 may be carried out during contact between the surface treatment solution of the present invention and the gold or gold alloy plating film, electrolysis is not essential in the method using the surface treatment solution of the present invention and an adequate effect is obtained simply by contact without electrolysis.

After contact between the surface treatment solution of the present invention and the gold or gold alloy plating film, it is preferable to conduct drying after driving off the surface treatment solution using an air gun or such as is without washing with water or the like.

Examples of the objects of application of the present invention are gold or gold alloy plating layers having nickel or an alloy thereof in the underlayer or substrate. When water, chlorides, sulfide, cyanides, nitrides, ammonia salts, or other such corrosive substances are present in pinholes present on the gold or gold alloy plating film of the surface in such cases, the nickel or nickel alloy or the like which is the underlying metal or substrate metal elutes (corrodes), and the corroded material deposits on the surface, possibly harming the appearance, lowering the solder wettability, raising the contact resistance, and causing other such problems. The present invention is effective in preventing such corrosion.

The surface treatment method and surface treatment solution of the present invention can be used in the surface treatment of articles having a gold or gold alloy plating film formed on a metal. Examples of articles to which the present invention is applied include connectors, switches, and printed circuit boards having a gold plating or gold alloy plating film.

WORKING EXAMPLES

The present invention is explained based on working examples below, but these working examples in no way limit the scope of the invention.

Test Methods

1. Nitric Acid Aeration Test

A nitric acid aeration test was conducted based on the Electronic Industries Alliance (EIA) of the United States standard EIA/ECA-364-26B. Specifically, 70% nitric acid (manufactured by Kanto Chemical Co., Ltd., guaranteed reagent) was placed in a quantity of 50 mL/L desiccator in desiccators (manufactured by AS ONE) in an environment having humidity of 60% or less and room temperature of 23±2° C., closed with a lid and allowed to stand for 30±5 minutes. The test sample was then set in a holder and placed quickly in the desiccator. After standing in the desiccator for 2 hours±5 minutes, it was removed, immediately placed in a 125±5° C. air-circulating oven (manufactured by Espec Corp., IPHH-201), and allowed to stand for 10-15 minutes. The sample was removed from the oven, cooled to room temperature, and evaluated within one hour. Corrosion discernable at a magnification of 10× by microscope (manufactured by Olympus, BX51M) was measured within a 1 cm×1 cm range in evaluation.

2. Solder Wetting Spreadability Test

A test sample was heated for one minute at 260° C. in a reflow furnace (manufactured by Japan Pulse Laboratories, Inc., RF-330) three times to induce accelerated degradation. The test sample to which an inert rosin flux had been applied was dipped for 4 seconds in a solder pot containing 96.5% tin, 3.0% silver, and 0.5% copper heated to 245° C. The sample was evaluated by examining the ratio of the ranges of exposed solder and underlayer visually.

3. Contact Resistance Test

Test samples were prepared without heat treatment and with heat treatment three times for 1 minute at 260° C. in a reflow furnace. The sample was fixed using a contact resistance measurement system MS880 (manufactured by K.S. Electric Parts Institute) and measured at a current value of 1 mA under a 1 g load.

Working Examples 1 and 2 and Comparative Examples 1-6

Process

A copper plate having nickel plating on the surface (100 mm×67 mm, thickness 0.3 mm, negative plate for a Hull cell manufactured by Yamamoto-MS Co., Ltd.) was cut to 25 mm×67 mm, thickness 0.3 mm Electroplating was performed for 7 seconds at 20 A/dm at 60° C. using Ronovel CS-200 (gold electroplating solution manufactured by Dow Electronics), and a 0.38 μm thick gold plating film was formed. After washing with pure water for one minute at room temperature, the plate was dipped for 5 seconds at 25° C. in the surface treatment solution listed in each of the following working or comparative examples.

After removing the treated piece, the liquid was removed by air gun at a pressure of 0.2 MP, and it was dried for 5 seconds thereafter using a dryer.

The gold plating film obtained after treatment was subjected to the following tests.

Surface treatment was conducted according to the above process using surface treatment solution obtained by dissolving the compounds listed below in Table 1 in water to make the stated concentration. The treated gold plating film obtained was subjected to a nitric acid aeration test. The results appear in Table 1.

TABLE 1

Number of corrosions developed due to nitric acid aeration test (2-hour) (measurement range: 1 × 1 cm)

| | Treatment solution or compound in treatment solution | Concentration | Corrosion number |
|---|---|---|---|
| Working example 1 | Bis(3-sulfopropyl)disulfide, disodium | 1 g/L | 24 |
| Working example 2 | Diethyldithiocarbamate sulfopropanesulfonic acid $(C_2H_5)_5NCS\text{-}SS\text{-}(CH_2)_3\text{-}SO_3H$ | 1 g/L | 100 |
| Comparative example 1 | (none) | 1 g/L | >1000 |
| Comparative example 2 | Mercaptobenzothiazole | 1 g/L | 201 |
| Comparative example 3 | 3,6-Dithia-1,8-octadiol | 1 g/L | 200 |
| Comparative example 4 | (O-ethyldithiocarbonate)-S-(3-sulfopropyl)ester, potassium salt | 1 g/L | 120 |
| Comparative example 5 | Mercaptosuccinic acid | 1 g/L | 212 |
| Comparative example 6 | Sodium thiosulfate | 1 g/L | 112 |

Surface treatment by bis(3-sulfopropyl)disulfide, disodium (Working Example 1) and diethyldithiocarbamate sulfopropanesulfonic acid (Working Example 2) significantly decreased the corrosion number in comparison to no surface treatment by surface treatment solution (Comparative Example 1). The surface treatment solution of the present invention is also understood to have a better corrosionsuppressing effect than that obtained by using the mercaptobenzothiazole (Comparative Example 2) described in a prior art reference.

Working Example 3

A surface treatment solution of the following composition was prepared.

| Surface treatment solution A | |
|---|---|
| Bis(3-sulfopropyl)disulfide disodium | 2 g/L |
| Polyethylene glycol (molecular weight 12,000) | 2 g/L |
| Potassium hydroxide | 0.1 g/L |
| Remainder | Water |
| (Aqueous solution pH = 11) | |

Test samples were produced at current densities of 5, 10, 20, 30, 40, and 50 ASD during gold plating as described above in Process above, and surface treatment was then carried out in accordance with the above process using surface treatment solution A.

The gold plating film after treatment was subjected to a nitric acid aeration test. The results are shown in Table 2.

Comparative Example 7

The same procedure as in Working Example 3 was carried out except that the surface treatment solution of Working Example 3 was not used. The results are shown in Table 2.

TABLE 2

Number of corrosions developed due to nitric acid aeration test (2-hour) (measurement range: 1 cm diameter)

| | Type of surface treatment solution | 5 ASD | 10 ASD | 20 ASD | 30 ASD | 40 ASD | 50 ASD |
|---|---|---|---|---|---|---|---|
| Working example 3 | Surface treatment solution | 0 | 0 | 0 | 0 | 0 | 0 |
| Comparative example 7 | Not treated | 26 | >500 | >1000 | >1000 | >1000 | >1000 |

Working Examples 4-6 and Comparative Example 8

Surface treatment solutions of the following compositions were prepared.

| Surface treatment solution B | |
|---|---|
| Bis(3-sulfopropyl)disulfide disodium | 1 g/L |
| Polyethylene glycol (molecular weight 12,000) | 1 g/L |
| Potassium hydroxide | 0.05 g/L |
| Remainder | Water |
| (Aqueous solution pH = 11) | |

| Surface treatment solution C | |
|---|---|
| Bis(3-sulfopropyl)disulfide disodium | 4 g/L |
| Polyethylene glycol (molecular weight 12,000) | 4 g/L |
| Potassium hydroxide | 0.2 g/L |
| Remainder | Water |
| (Aqueous solution pH = 11) | |

After treating gold plating film by the same procedure as in Working Example 1 except that surface treatment solution A (Working Example 5), surface treatment solution B (Working Example 4), or surface treatment solution C (Working Example 6) was used, the solder wetting spreadability and contact resistance were measured by the above test methods. The results are shown in Tables 3 and 4. The solder wetting spreadability was also tested using a sample with a plating time of 0.8 second (gold plating film thickness 0.0254 μm) in gold plating according to the Process described above in Working Example 1. An example in which surface treatment was not conducted served as Comparative Example 8. The results appear in Tables 3 and 4.

TABLE 3

Solder wetting spreadability (heat treatment: three times at 260° C./1 minute)

| | Comparative example 8 | Working example 4 | Working example 5 | Working example 6 |
|---|---|---|---|---|
| Type of surface treatment solution | Not treated | B | A | C |
| Gold; 0.0254 μm | 100% | 100% | 100% | 100% |
| Gold; 0.381 μm | 100% | 100% | 100% | 100% |

TABLE 4

Contact resistance (heat treatment conditions: three times at 260° C./1 minute)

| | Comparative example 8 | Working example 4 | Working example 5 | Working example 6 |
|---|---|---|---|---|
| Type of surface treatment solution | Not treated | B | A | C |
| After surface treatment | 9.7 mΩ | 9.8 mΩ | 12 mΩ | 12 mΩ |
| After heat treatment | 9.3 mΩ | 9.9 mΩ | 9.6 mΩ | 11 mΩ |

As is evident from Table 3, the surface treatment solution of the present invention has equivalent solder wetting spreadability to no treatment and is understood not to inhibited solder wettability. As is also evident from Table 4, treatment by the surface treatment solution of the present invention is understood to be within a sufficiently practical range even though the contact resistance is higher at 12 mΩ. than without treatment.

What is claimed is:
1. A surface treatment method for gold or gold alloy plating film formed on nickel or nickel alloy underlayer, wherein the surface treatment method comprises a step for bringing the gold or gold alloy plating film formed on the nickel or nickel alloy underlayer into contact with a surface treatment solution consisting of water, at least one type of disulfide compound, wherein the disulfide compound is represented by the following formula (2):

$$X^1O_3S-R^3-S-S-R^4-SO_3X^2 \qquad (2)$$

wherein $R^3$ and $R^4$ independently represent a linear or branched alkylene group having from 1 to 6 carbon atoms, or phenylene group, $R^3$ and $R^4$ independently may be substituted by one or more substituents selected from halogen atom, hydroxyl group, or alkoxy group, and $X^1$ and $X^2$ represent monovalent cations, a nonionic surfactant and a pH adjuster chosen from hydrochloric acid, nitric acid, sulfuric acid, citric acid, potassium hydroxide, sodium hydroxide or carbonates, wherein a pH of the surface treatment solution is 3 or higher.

2. The surface treatment method of claim 1, wherein the nonionic surfactant is chosen from polyethylene glycol, polyoxyalkylene monobutyl ether, polyoxypropylene glycol or ethylene glycol-propylene glycol block polymers.

* * * * *